United States Patent [19]

Hassan et al.

[11] 4,019,015
[45] Apr. 19, 1977

[54] PRECISION TOOL AND WORKPIECE POSITIONING APPARATUS WITH RINGOUT DETECTION

[75] Inventors: Javathu K. Hassan, Hopewell Junction; Carl V. Rabstejnek, Wappingers Falls; Anthony D. Wutka, Fishkill, all of N.Y.

[73] Assignee: International Business Machines Corporation, Armonk, N.Y.

[22] Filed: Feb. 26, 1975

[21] Appl. No.: 553,385

Related U.S. Application Data

[62] Division of Ser. No. 395,502, Sept. 10, 1973, Pat. No. 3,886,421.

[52] U.S. Cl. .......................................... 219/121 EB
[51] Int. Cl.² ........................................... B23K 15/00
[58] Field of Search .............. 219/121 EB, 121 EM, 219/121 R; 250/492 A, 492 B, 492; 318/593, 601, 617, 615, 624

[56] References Cited

UNITED STATES PATENTS

| | | | |
|---|---|---|---|
| 3,644,700 | 2/1972 | Kruppa et al. | 219/121 EB |
| 3,648,048 | 3/1972 | Cahan et al. | 250/492 A |
| 3,651,303 | 3/1972 | Rehme et al. | 219/121 EB |
| 3,699,334 | 10/1972 | Cohen et al. | 250/492 A |
| 3,842,236 | 10/1974 | Von Walter | 219/121 EM |

*Primary Examiner*—J. V. Truhe
*Assistant Examiner*—Clifford C. Shaw
*Attorney, Agent, or Firm*—William J. Dick

[57] ABSTRACT

Apparatus for positioning a workpiece and tool in a precise location relative to each other by positioning in a predetermined site the workpiece, and then positioning the tool in a precise predetermined position relative to the site in minimum total time. The apparatus comprises a closed loop position and velocity sensitive servo system connected to the workpiece, the servo system including positioning apparatus for positioning the workpiece in a predetermined site. A position indicator determines the actual position to the workpiece relative to a fixed reference and emits a signal output which is compared, in an error generator, with the desired position of the workpiece relative to the reference. The difference signal, from the error generator, is applied to the positioner and is used to bring the workpiece into the site. The positioner is provided with velocity feedback which cooperates with the positioning signal from the error generator to drive the workpiece into the predetermined site. Thereafter the error between the actual position address and the desired position address, although very small, is fed to second apparatus for positioning the tool a very small amount to precisely position the tool relative to the workpiece.

2 Claims, 18 Drawing Figures

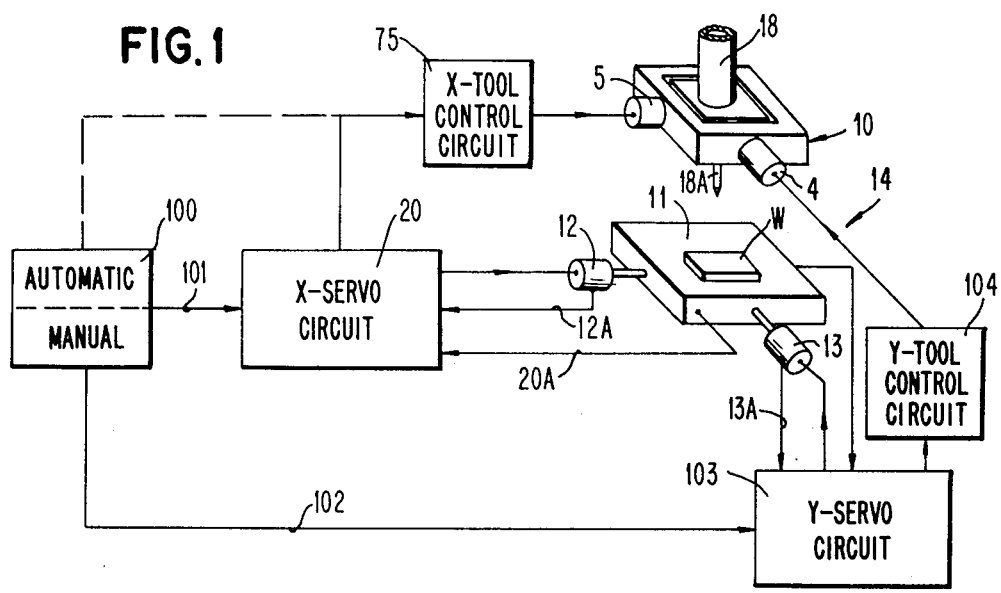
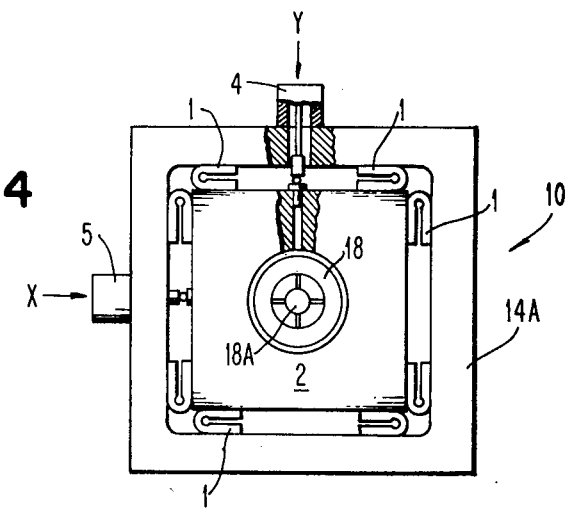
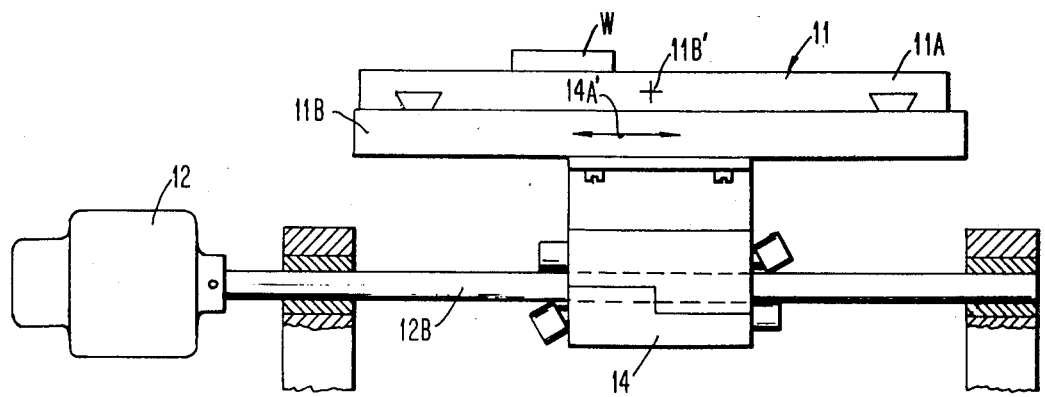

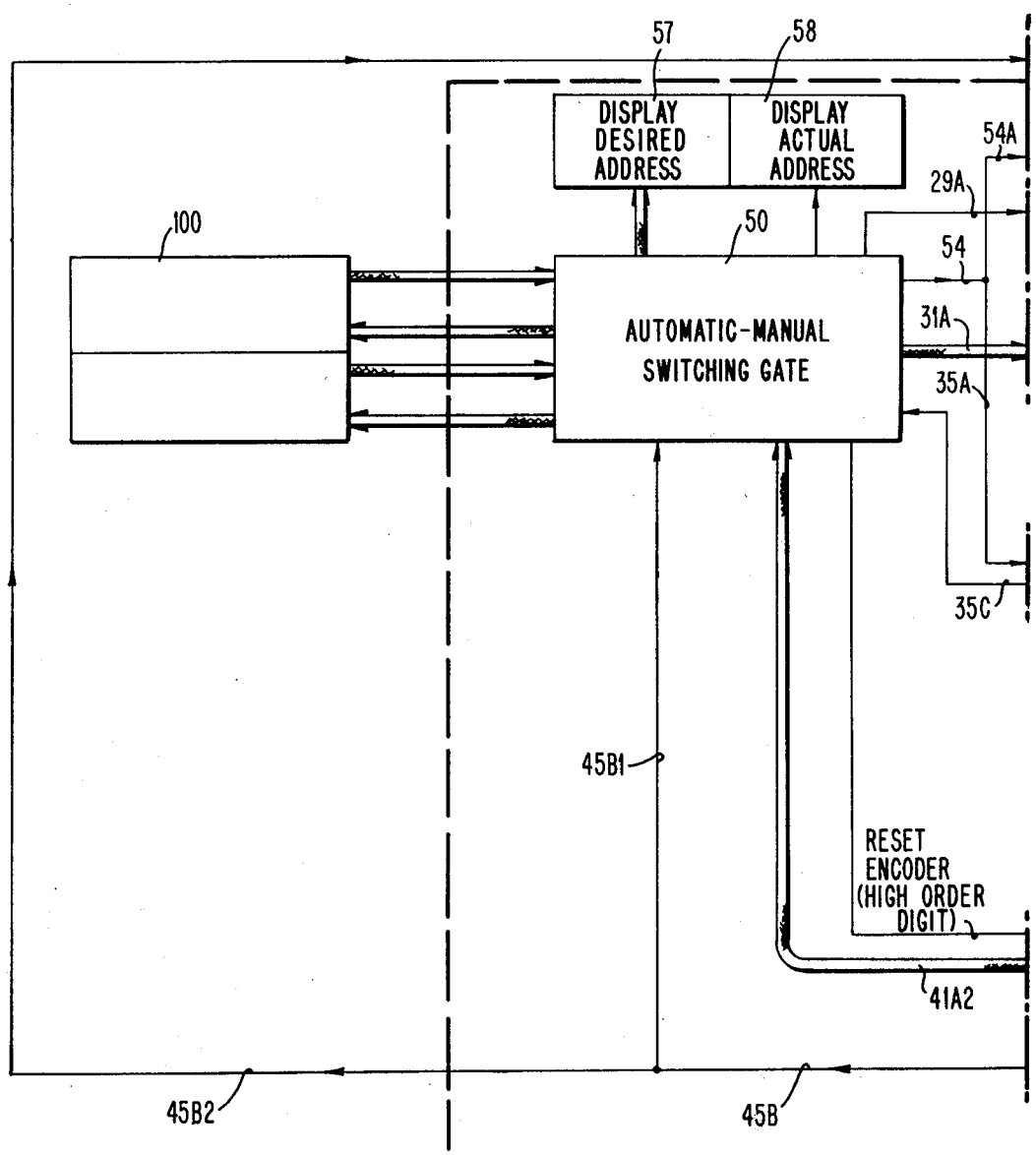

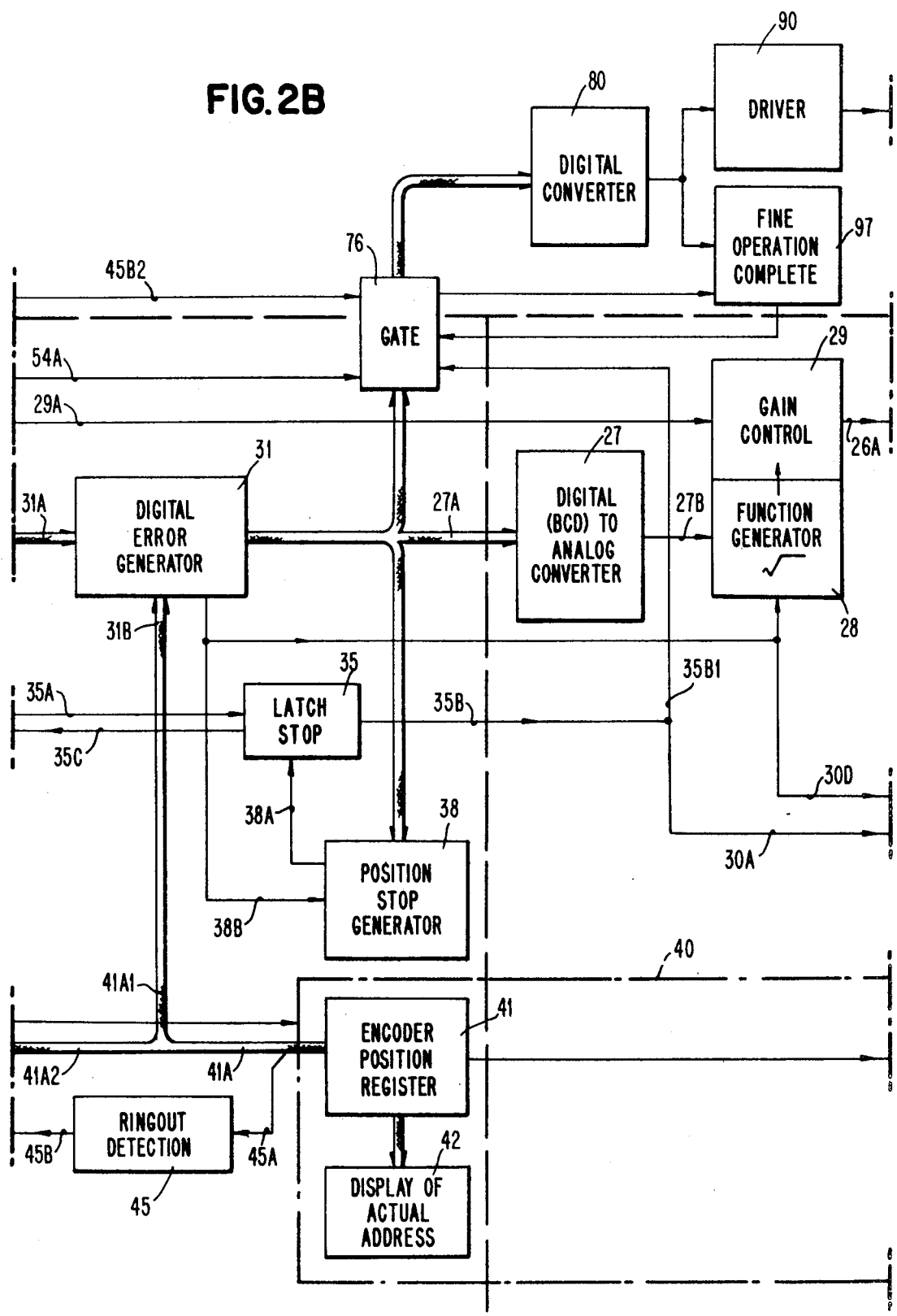

PRECISION TOOL AND WORKPIECE POSITIONING APPARATUS WITH RINGOUT DETECTION

RELATION TO OTHER APPLICATIONS

This application is a division of application, Ser. No. 395,502, filed on Sept. 10, 1973, now U.S. Pat. No. 3,886,421, issued on May 27, 1975.

SUMMARY OF THE INVENTION AND STATE OF THE PRIOR ART

The present invention relates to positioning apparatus, and more particularly relates to a workpiece and tool positioning system in which the workpiece is brought into a predetermined site of small area location and thereafter, utilizing the difference between the desired and actual position of the workpiece, the tool is positioned into a precise predetermined location relative to the workpiece.

Numerous examples of servo positioning systems exist in the prior art, the servo systems containing means for positioning a load with positional velocity, or both types of feedback. Both types of feedback and combinations thereof are advantageous, positional feedback decreasing the rate of positioning to inhibit hunting, while velocity feedback serves to proportionately dampen servo response. An example of some of the prior art is the U.S. Pat. Nos. to Allen, 3,241,015; McKenney, 2,913,649; Dickerson, 3,377,544; Husted, 2,674,708; and Plummer, 3,660,744. Many of the references above cited utilize both position feedback and velocity feedback and combinations of both for ultimately positioning the workpiece. However, when speed of positioning is important, it is difficult if not impossible to achieve precise location of the workpiece without a certain amount of hunting and time for stabilizing (ring out) of the system.

Also described in the art is the provision to position a tool relative to a workpiece, such as described "I C Pattern Exposure by Scanning Electron Beam Apparatus" by S. Miyauchi, et al., SOLID STATE TECHNOLOGY, July 1969, pp. 43–48.

In machine tools, for example, the precise location of the workpiece relative to the tool which is to perform the operation on the workpiece is extremely important, and if the operation is a repetitive one, the time for ring out of the system and to stop the hunting of the system for operation to the tool on the workpiece can be an extremely important factor in system design effecting throughput. The total time for precise workpiece to pool positioning is composed of: Workpiece Movement = acceleration, constant velocity, deacceleration (which is virtually eliminated with the apparatus of the present invention) + position hunting + ringout of residual energy, and secondary tool positioning.

In the positioning of, for example, an electron beam sometimes referred to as an E-beam, relative to a semiconductor chip in a semiconductor wafer, to write the circuit pattern onto the topology of the chip, the initial precise location of the E-beam relative to the chip is absolutely necessary to achieve the desired result, for subsequent working of the chip by the E-beam. The system described hereinafter has found an advantage in the E-beam technology because of its speed and preciseness of registration of the tool to the workpiece. Utilizing the electron beam, as an example, and other examples are given in the specification, the philosophy of the system and apparatus will be more easily understood. Considering a workpiece and tool that must, at least at the outset, be precisely positioned one relative to the other, if the heavier mass of the two may be positioned within a band of tolerance, or within the general locale of the position one relative to the other, the lighter mass or easier to move element, for example, the tool, may be moved the remaining distance to position the tool in a precise location relative to the workpiece. An electron beam, for example, has the inherent capability of compensating for certain errors in the X and Y position of the workpiece, as long as the error is known. Therefore, starting with this design philosophy, it is not necessary to position the X–Y positioning of the workpiece, such as a semiconductor wafer, within extremely small tolerance bands around an ideal position. It is required, however, to resolve the true position of the workpiece within very small increments, for example 50 microinches or less. Thus the system employed is a position feedback of the table's location. Once workpiece location is known and is set within a certain predetermined tolerance area or site, movement of the workpiece or the X—Y table which is used to position the workpiece, may be stopped and the additional correction necessary to precisely position the E-beam may be applied to the electrostatic deflection plates of the E-beam to position the beam in a precise manner relative to the workpiece. As may be expected, considerable time may be gained because the electro-mechanical drive of the heavier X-Y stage does not have to "hunt" for the ideal position. For example, when the drive motor connected to the stage (workpiece stage) has been deaccelerated to the approximate location or site specified, it may be stopped. The position feedback error may then be applied in a predictable manner to electronic compensation to the electrostatic deflection plates of the E-beam.

The basic velocity and position servo loop, which has already heretofore been alluded to, is a standard loop. However, recognizing the value of an incremental distance to be moved, the intended usage in the system described is somewhat different. In the system, the loop is tuned to obtain a uniform introduction of energy (acceleration and constant velocity), and a uniform removal energy (deacceleration and stop). The intent is to effectively utilize the motors torque to move and arrest the workpiece or X-Y table as quickly as possible with a minimum of structural deformation of the mechanical components. Structural deformations which remain after the table is stopped represents energy that must be dissipated as vibrations or ring out. During this unstable period no operation may be performed. Accordingly, it is necessary to tune the system to achieve an optimum trade-off between the speed of positioning and ring out in order to achieve the shortest possible time until work may be performed on the workpiece by the tool.

In view of the above it is a principal object of this system to provide minimum overhead time to position a workpiece relative to a tool and a tool relative to a workpiece (tool and workpiece relative to each other) providing maximum throughput of operations of tool on workpiece.

Another principal object of the present invention is to provide a precise workpiece and tool positioning system in which one of the workpiece or tool is roughly positioned or positioned within a site, and then the other of the workpiece and tool is positioned accurately within this site and at an exact position of the one relative to the other.

Still another object of the present invention is to provide a control system for element positioning relative to a second element, in which the control may be accomplished if desired, by any number of automatic positioning systems such as employing a digital computer.

Yet another principal object of the present invention is to provide a system which may be controlled by digital information and in which the low order bits of an actual first element position may be monitored for changes in status to determine the minimum time when the ring out of residual energy is accomplished and for energizing the means for deflecting or otherwise moving a second element relative to the first element.

Other objects and a more complete understanding of the invention may be had by referring to the following specification and claims taken in conjunction with the accompanying drawings in which:

FIG. 1 is a simplified schematic block diagram of the apparatus of the present invention;

FIG. 3 is a fragmentary side elevational view of a typical X-Y stage which may be used with apparatus of the present invention;

FIG. 4 is a fragmentary plan view of a typical tool holder which may be employed with the apparatus of the present invention;

GENERAL DESCRIPTION

Figure 2C:
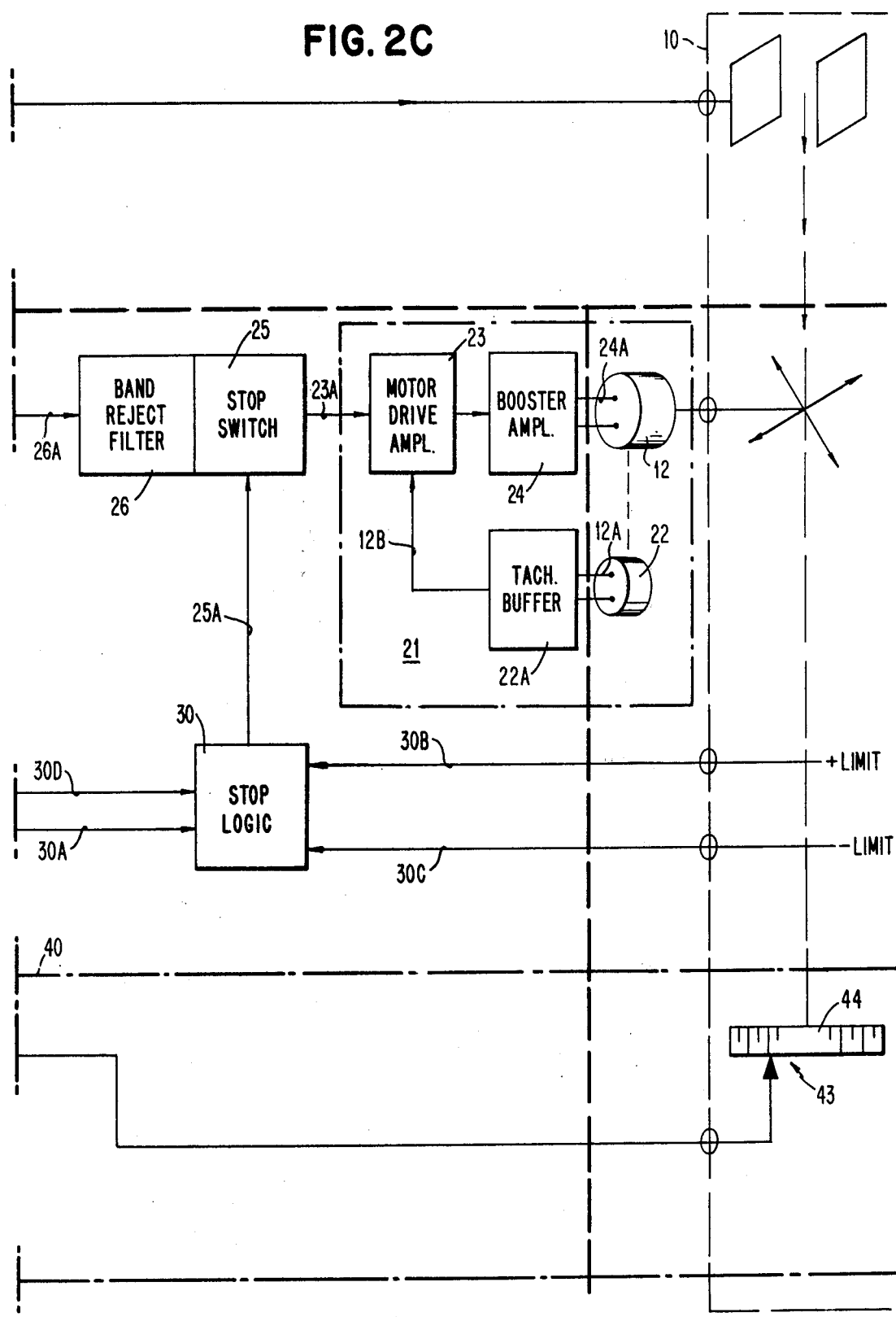
FIG. 2 is a composite drawing illustrating the arrangement of FIGS. 2A, 2B and 2C which are block diagrams in more detail of the complete system employing the apparatus of the present invention.

Referring now to the drawings and specifically FIG. 1 thereof, a simplified functional block diagram of apparatus constructed in accordance with the present invention is illustrated therein. As shown, a first element or tool 10 is located adjacent a second element or workpiece W mounted on an X-Y stage 11. Stage drive means including motors 12 and 13 are connected respectively for driving the X and Y portions of the X-Y stage 11, the motors being responsive to a desired position address from a control unit 100. As illustrated, the desired address of the position of the workpiece W, and thus the stage 11 in the X direction is controlled by a signal output along line 101 to the X servo circuitry 20, while the Y direction of the X-Y stage is controlled by an address along line 102, emanating from the control 100, to the Y servo circuitry 103. As shown, actual positional feedback information is fed back to the X and Y servo circuitry through feedback loops 20A and 103A respectively. In a like manner, velocity feedback, within the stage drive means, is fed back respectively through lines 12A and 13A.

The circuitry in both the X and Y servo circuitry 20 and 103 is set so that when the X-Y stage 11 and thus the workpiece W is within a preset predetermined tolerance, or within a small site, (that is the address difference between the desired position and the actual position is within a very small tolerance) the motors 12 and 13 are latched. Thereafter, the address difference which still exists, albeit very small, is fed to an X-tool control circuitry 75 and Y-tool control circuitry 104 to effect a minor correction to the tool 10, causing the tool 10 to be realigned relative to the workpiece.

THE SYSTEM

Because the Y servo circuitry 103, associated motor and Y tool control circuitry 104 is identical to the X servo circuitry, motor, and X tool control circuitry, only one such circuitry will be discussed hereinafter. However, it should be recognized tht in order to achieve at least two degrees of freedom of the workpiece relative to the tool, each of the systems must be duplicated.

X-Y STAGE 11

A portion of the X-Y stage 11 is illustrated schematically in FIG. 3, the stage comprising upper and lower platforms 11A and 11B respectively, the lower platform 11B being connected in a conventional manner to a "Roh'lix" (trademark of Barry Wright Corporation) 14' which traverses in the direction of the arrow 14A' due to the rotation of the shaft 12B of the motor 12. The stage 11A is connected, in a like manner, to the motor 13, which is carried by the stage or platform 11B, and effects the motion of the stage 11A relative to the stage 11B into and out of the paper as shown by the tail of the arrow 11B'. It should be recognized that the X-Y stage 11 may be of any conventional form as long as it may be driven in some manner by the motors 12 and 13 respectively, and mechanically designed to provide sufficient servo response (i.e. taking into account such factors as stiffness, backlash, lead, inertia, resonance, etc.)

In the first embodiment of the tool 10, as shown in FIG. 4, very minute positioning of this tool may be obtained by a step and repeat micropositioning table 14 illustrated schematically in FIG. 1, and more completely in plan in FIG. 4. In the illustrated embodiment, the table 14 is shown housing a drill chuck or the like 18 with a drill 18A depending therefrom, it being desired to locate the drill precisely with reference to the workpiece W mounted on the X-Y stage 11. To this end, the micropositioning table 14 includes a frame 14 which may be connected to conventional apparatus for moving the member both vertically, so that the drill comes into contact with the workpiece W, and horizontally, either manually or under preprogrammed automatic positioning. However, inasmuch as this does not form part of the present invention, but is merely an example of the type of tool and the positioning thereof which may be utilized in accordance with the invention, the micropositioning table 14 will only be described in minor detail, a more complete description being set forth in Volume 12, No. 11, April 1970 pages 1958, 1959 of the IBM Technical Disclosure Bulletin. In the illustration of FIG. 4, the chuck 18 is mounted in the table 2 which is suspended from the frame 14A as by identical leaf springs 1, mounted at right angles to each other on the corners of the table 2. The springs have a high spring rate along the Z axis and lesser but equal spring rates along the X and Y axis of the table 2. The spring rates along the X and Y axis imparting repeatable positioning capability for the table. Thus the spring rates provide a deflection proportional to the X and Y forces imparted by force actuators or drive means 4 and 5.

The X servo circuitry, which is used as the example hereinafter, serves to take the desired position of the workpiece W, compare it to its actual position, and then drive the stage until the workpiece falls within a reasonable tolerance of where it is supposed to be, hereinafter referred to as "site," and thereafter provide any difference between the actual and desired position signal to the tool control circuitry 75 to drive the tool to effect a precise positioning of the tool relative to the workpiece. To this end, and referring first to FIG. 2C, the stage drive means 21 includes the motor 12, a tachometer 22 which may be integral with the motor 12 and which applies the feedback signal 12A to a tachometer buffer electronics 22A, which in turn applies a feedback signal through lead 12B to a motor drive amplifier 23, and then through a booster amplifier 24, which closes its loop by providing an input 24A to the stage drive motor 12. The stage drive means 21 may be referred to as a servo drive amplifier with tachometer damping feedback, such a system being shown in U.S. Pat. No. 2,674,708 to H. L. Husted. The motor drive amplifier 23 may be a standard off-the-shelf Inland Motor, Model No. EM1801 and purchased directly from Inland Motor Corporation of Radford, Virginia. The booster amplifier 24 is also standard and may be utilized, in accordance with Inland Motor's instructions for boosting the power output of the EM1801 from 25 to, for example, 200 watts. The drive stage motor 12 may be a standard servo motor such as an Inland Motors, Model No. NT 2909A, the tachometer 22 which, while being separate, may be mounted integrally with the motor and connected directly to the drive shaft which leads to the stage 11. A typical tachometer is the Inland Motor Model No. TG-1318C.

The tachometer 22 feedback signal is applied to the tachometer buffer 22A which is an operational amplifier adapted to filter out the noise generated by the tachometer (brush commutation in the tachometer) which gives a velocity (relative to voltage) feedback signal through line 12B to the motor drive amplifier 23 causing the motor drive amplifier to either increase or decrease its signal to the booster amplifier depending upon the positional information received, and discussed hereinafter, to the motor drive amplifier 23 from its first input at 23A. The tachometer buffer 22A is a purchased part and may be, for example, a Philbrick operational amplifier such as their part number 1016.

In order to stop the positional signal on line 23A to the motor drive amplifier when certain conditions exist, and therefore to stop the motor 12, a stop switch 25 may serve to open the positional signal information given to the motor drive amplifier 23. To this end, the stop switch, in effect, is an on-off switch, and may be a dual single pole single throw solid state switch such as the Dickson DAS 2137-1, although a relay with appropriate contacts may be utilized in the lieu thereof. The operation of the stop switch on conjunction with the stop logic, is described hereinafter.

Coupled to the stop switch is a band reject filter 26, to which the positional information may be applied as an input 26A, the position signal passing through the band reject filter and the stop switch 25 to the motor drive amplifier 23. The band reject filter 26 is a notch filter which attenuates the amplitude of the drive signal at the resonant frequency of the X-Y stage. For example, if the table resonates at 50 cycles, the band reject filter is tuned or otherwise designed for that particular frequency to minimize the amplitude at that frequency. The concept of a band reject filter for this purpose is not new in the art, for example see U.S. Pat. No. 3,660,744 issued on May 2, 1973 to Plummer.

Although the desired position input may be fed to the X servo circuitry 20 in either analog or digital form, the preciseness of digital form is preferred for such input to the circuitry. Accordingly, in order to drive the motor drive amplifier and thus the servo motor 12, means are provided for converting the digital information to analog information or a voltage level corresponding to the difference between the desired position and actual position, the digital difference preferably being expressed in the binary coded decimal format for ease of human readability, although it should be recognized that conventional digital binary numbers may be utilized to control the system. To this end and referring to FIG. 2B, a digital to analog converter 27 receives a difference signal in binary coded decimal form through inputs 27A, and provides an analog output along line 27B to a function generator 28, in the present instance a square root function generator. The function generator 28 differentiates the difference positional information coming in from the digital to analog converter 27 from output 27B which is a voltage level indicative of the difference in distance that the system must move to arrive at a predetermined position relative to some fixed reference. Inasmuch as the function generator is receiving an input voltage that corresponds to the address differential between the desired position and the actual position of the stage at any instance of time, since the first derivative of a position with respect to time is velocity, and inasmuch as it is desirable to maintain a uniform acceleration or deacceleration of the stage by way of the servo motor 12, the square root function is utilized in the generator 19 so as to make velocity dependent upon distance as opposed to being dependent upon time. For an example of a positioning system utilizing a function generator for this purpose, see U.S. Pat. No. 3,241,015 issued on Mar. 15, 1966 to Allen. The function generator may be an off-the-shelf module such as the model 4095/15 made by Burr-Brown Corporation. The binary coded decimal number to analog converter 27 may be one of several purchasable converters such as the Cycon Inc. converter Mod.

CY2735, made by Cycon Corporation of Sunnyvale, California.

The square root function generator performs acceptably in the implemented embodiment because inherent time constants in the hardware tend to attenuate the instantaneous changes in acceleration at the start, middle and end of the stepping increment. This potential impulse function has been treated extensively in cam design literature, and is commonly called jerk or pulse to define the instantaneous rate of change of acceleration. A suitable treatment of pulse is in *CAMS Design, Dynamics, and Accuracy*, Harold A. Rothbart, John Wiley and Sons, Inc., New York, 1956, Chapter 2. The treatment deals with the parabolic function which the square root function theoretically generates and the more desirable cycloidal function.

The output of the function generator is through a gain control amplifier 29 which serves to limit the voltage to the band reject filter 26 and ultimately the motor drive amplifier 23. The gain control 29 may be set at some selected level, as by limiting the gain of the amplifier by input 29A from the control 100, as when the stage 11 approaches its final position or site. There are three separate conditions which can apply a stop signal to the stop switch 25 and cause the motor drive amplifier 23 to prevent further driving of the motor 12, these being: (1) position stop, that is when the table reaches the position for which it was intended i.e. within the site; (2) a positive limit stop; and (3) a negative limit stop.

To this end and referring to FIG. 2C, a stop logic circuit 30 is illustrated as having four inputs, a first input 30A from a latch stop circuit 35, hereinafter described, and which indicates that the stage 11 has reached its desired position or site, a second input 30B which indicates that the stage 11 has travelled beyond its limit in the positive direction, and a negative limit input 30C which indicates that the stage has moved in the negative direction into its limit switch. A fourth input, 30D, is applied to the stop logic circuitry to reverse the polarity to allow the stop logic to "come off" the limit switches. The output of the stop logic 30 is applied through line 25A as an input to the stop switch 25.

Figure 5:
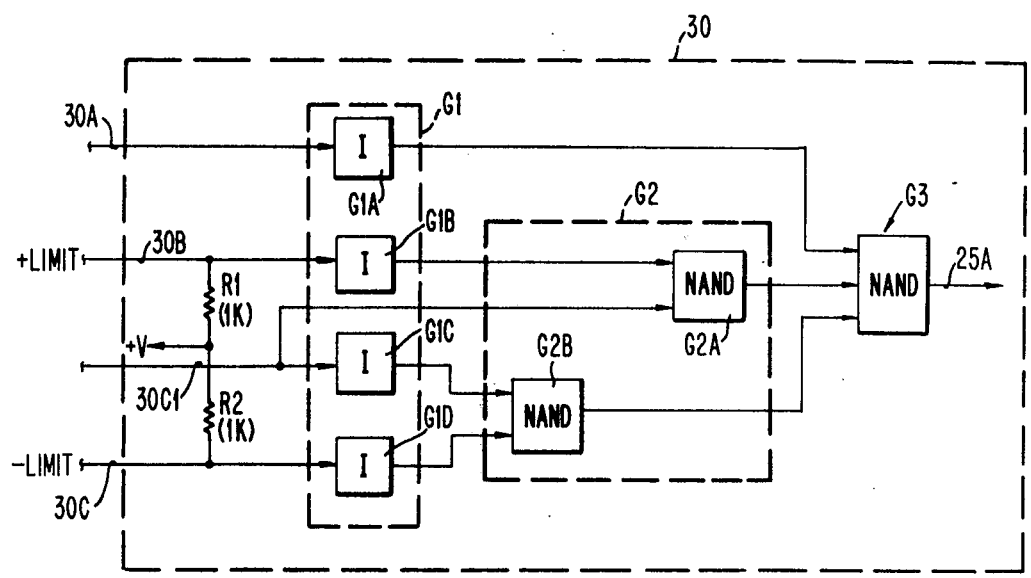
FIG. 5 is a schematic diagram of a portion of the apparatus illustrated in FIG. 2.

Thus the stop logic 30 acts as an interface between the various stop command sources and the stop switch 25, which when open, stops any signal from being applied to the motor drive amplifier 23 and stops the motor 12. To this end, and referring now to FIG. 5, three TTL modules G1, G2 and G3 make up the gating network for controlling the on-off state of the stop switch 25 and therefore the motor 12. G1 may be a type 7404 hex inverter, that is it has six inputs and six outputs. G1 drives G2 which is a type 7400 quad, two input NAND gate. The outputs of the G2 module drive the G3 module which may be a type 7420 dual, four input NAND gate.

The outputs from module G1, the hex inverter, are always opposite their corresponding inputs. The operation of the NAND logic blocks, G2 and G3 can be explained by saying that the only way to get a logic low output is to have all inputs at a logic high. All logic lows or any high, low combination on the NAND inputs results in a logic high out.

Referring now to the three ways in which the stop logic 30 effects a stop or opens switch 25, the various stop signals 30A-30C will be treated serially.

1. Position Stop

When the table or stage 11 reaches near the positon or site intended, a logic high is applied to input 30A to the stop logic 30. This input emanates from the latch stop circuit 35 which will be discussed hereinafter. The logic high from input 30A is then applied to an inverter G1A which produces a low at one of the inputs of NAND gate 63. Although NAND gate G3 has three other inputs, regardless of their levels, a low at the first input to G3 (i.e. the output of G1A) demands that the output of G3 on line 25A, is high. (Any low applied to the input of a NAND gate produces a high output).

2. POSITIVE LIMIT STOP

If for any reason the stage arrives at the end of its travel in the positive direction, a positive limit stop for example a limit switch (not shown) will stop the motor. When the table is not against the positive limit stop, the input at 30B is a logic high, which is provided by pull-up resistor R1, typical values of which are given in FIG. 5. If a positive limit is reached, a logic low is applied to inverter G1B. G1B, in turn, places a high on one input of G2A. Inasmuch as the motor 12 was moving in a positive direction, the sign input at 30C1 is at a logic high which is applied to the second input of NAND gate G2A. The output, therefore, of NAND gate G2A goes low which effects a high or an up output along line 25A from NAND gate G3.

3. NEGATIVE LIMIT STOP

Should the table reach a negative limit, that is strike a limit switch (not shown) indicating that it had travelled too far in the negative direction, the high level on the input to G1D is replaced by a low, the high level being provided initially by pull-up resistor R2. The output of inverter G1D, which is high therefor, is applied as an input to NAND gate G2B. Since the motor 12 was moving in a negative direction (in order to hit the negative stop) the sign input along input 30C1 is at a logic low. Because the low is applied to inverter G1C, the upper input the NAND gate G2B is a logic high causing the NAND gate G2B's output or input to NAND gate G3 to be a low, effecting a logic high output on line 25A from NAND gate G3.

Simply stated the limit stops, above described, inhibit motion when a limit switch is actuated in the direction toward the limit switch. Alternately, the motion in the direction which would back the table off the actuated switch is not inhibited.

Thus all three stopping modes effect a high output at G3. Such a high output along line 25A causes the stop switch 25 to open thereby preventing further driving of the motor 12.

In order to provide the digital to analog converter 27, via its input bus 27A with a binary coded decimal difference between the desired position and actual position of the stage or workpiece, comparing means 31 is provided, in the present instance the comparing means comprising a digital error generator. To this end, and referring first to FIG. 2B, the digital error generator includes a first or primary input 31A to which is fed the BCD address corresponding to the desired position of the workpiece or stage relative to some fixed reference. A second input bus 31B feeds a binary coded decimal number corresponding, at any one period of time, to the actual position of the workpiece or stage from a position indicating means 40, which is described hereinafter. Although the digital error generator may be of conventional structure, the particular structure utilized is best illustrated in FIGS. 6–9.

The digital error generator takes the form of a binary coded decimal subtractor. To subtract two numbers of the base 10, the subtrahend is 9's complemented (each digit is subtracted from 9) and then added to the minuend. In this system, if the sum has a carry, the carry is brought around and added to the least significant digit (LSD) of the sum. This technique is commonly referred to as "end around carry." The sum is then equal to the dividend of the original subtraction. If the sum does not have a carry, then the sum is 9's complemented. This means that the dividend is negative. Thus the digital representation of the stage position which is referred to in the drawings as input B, corresponding to the bus 31B, is subtracted from the desired position, referred to in the drawings as input A corresponding to the signal from bus 31A, using the 9's complement method. The dividend is converted by way of the digital to analog converter 27 and, in the manner heretofore described, fed to the motor drive amplifier 23.

It should be noted that the subtraction could be made using a 10's complement method (each number is subtracted from 9 and then 1 is added to the result). This would not require the carry to be added to the sum, but does require additional logic necessary to add 1 when the number is complemented. As in the 9's complement method, if there is not carry the sum is then 10's complemented and considered negative. If there is a carry, it is just ignored. However, because of the additional circuitry required for the 10's complement method, the 9's complement method may be preferable, and as illustrated in FIGS. 6–9.

Figure 6:
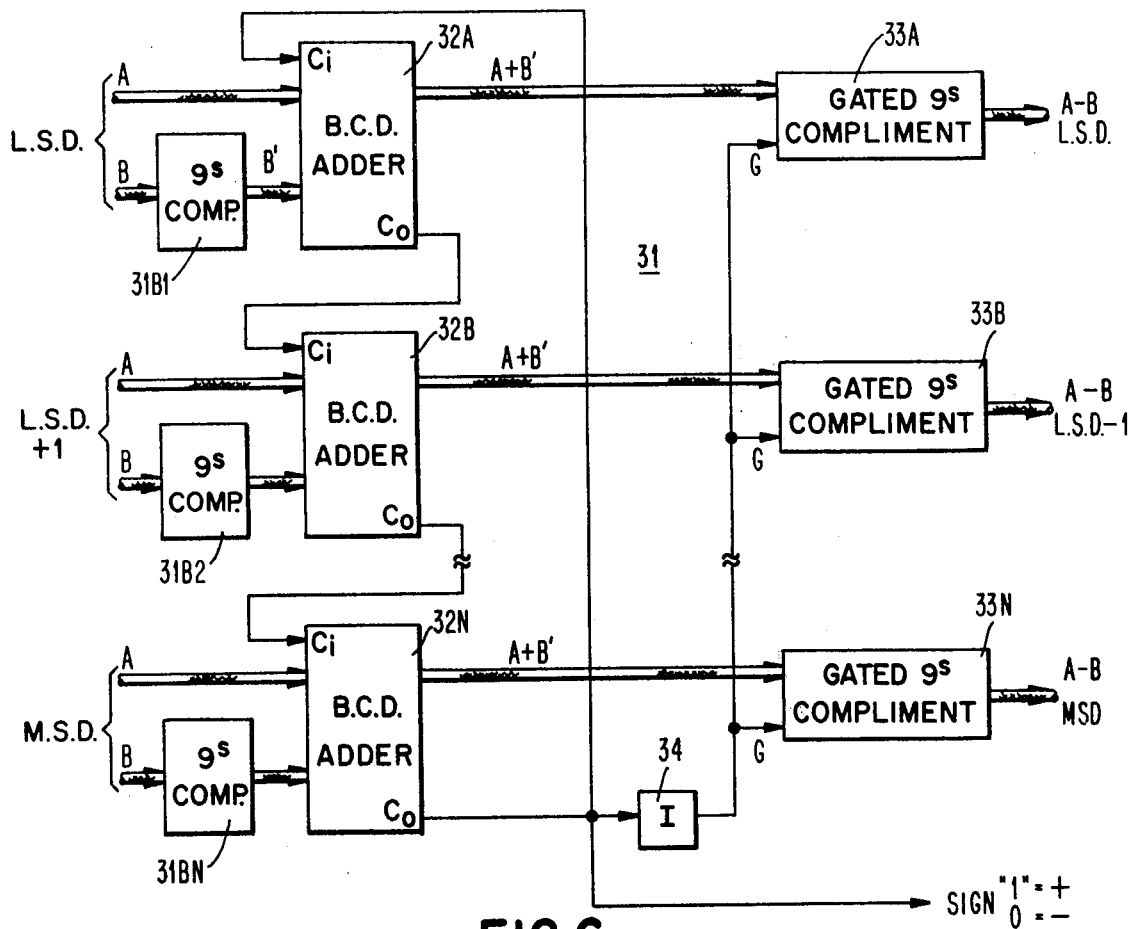
FIG. 6 is a schematic diagram of a typical comparing means which may be employed in the apparatus of the present invention.
Figure 7:
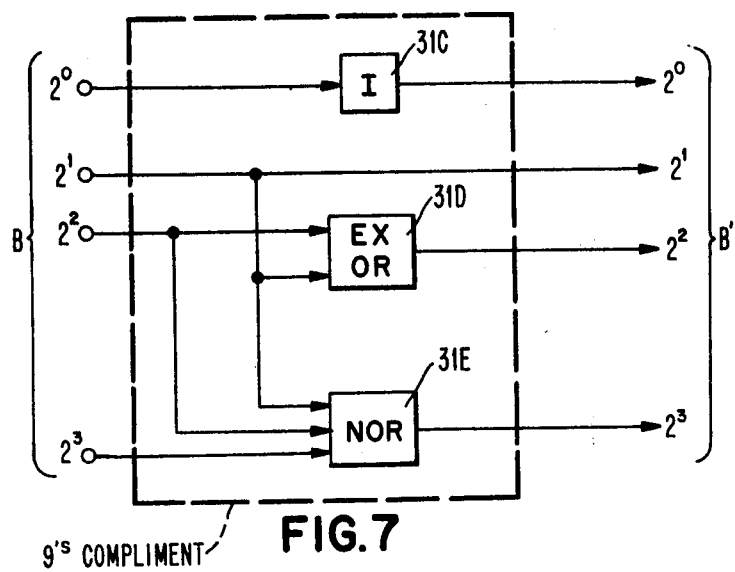
FIG. 7 is a schematic drawing of a portion of the comparing means illustrated in FIG. 6.

Turning now to FIG. 6, the overall scheme of the comparing means or digital error generator 31 is illustrated therein. In the embodiment shown, the input A corresponds to the address of the desired position of the table, while the input B corresponds to the address in binary coded decimal numbers of the actual position of the stage or table. As illustrated, each pair of inputs is coupled to a BCD adder 32A, 32B through 32N, each of the adders having an output therefrom coupled to gated 9's complement circuitry 33A, 33B, 33N. The dividend or output from each of the gated 9's complement circuitry blocks is the binary coded decimal number corresponding to the difference between the address of the actual position and the address of the desired position. For ease of reading, the least significant digit (LSD) to the most significant digit (MSD) has been labelled both at the input and output. As is conventional, each of the binary coded decimal (BCD) adders 32A–32N has a carry input (CI) and a carry output (CO) each preceding carry out (CO) being coupled to the next succeeding carry in (CI) except the last carry out in the binary coded decimal adder 32N, corresponding to the most significant digit MSD, is coupled to an inverter 34 the output of which is coupled to each of the gated 9's complement 33A–33N and the input of which is coupled to the carry in (CI) of the binary coded decimal adder 32A. Additionally an output indicative of the sign, as marked, is taken from the carry out of adder 32N (MSD). As illustrated each of the B inputs, before being applied as an input to the binary coded decimal adder passes a 9's complementing circuit designated 31B1, 31B2, and 31BN. In operation, input A is the minuend while word or input B is the subtrahend, the subtrahend being complemented by the 9's complement circuit and then added in the adder to word A. In the instance where there is no carry, the sum of A and B (A + B') is complemented. On the other hand if there is a carry, the sum is increased by 1 but not complemented. This occurs in the gated 9's complemented circuitry.

Each of the 9's complement circuits includes an inverter 31C, and exclusive OR logic gate 31D and a NOR gate 31E, the inverter 31C receiving the least significant bit of the group of bits $2^0 - 2^3$. As shown, the next most significant bit, $2^1$, is coupled directly to the output, while it is also provided as an input along with $2^2$ bit to the exclusive OR gate 31D to provide an output $2^2$. The NOR gate 31E receives inputs from both the $2^1$ and $2^2$ as well as the $2^3$ bit, the gates acting in a conventional manner to apply an output therefrom which acts as the input to its associated binary coded decimal adder. To aid in an understanding of the design philosophy of the 9's complement and the gated 9's complement circuits, the following table with notes is supplied.

| No. | Compl. | BCD | | | | COMPL. | | | |
|---|---|---|---|---|---|---|---|---|---|
| | | $2^3$ | $2^2$ | $2^1$ | $2^0$ | $2^3$ | $2^2$ | $2^1$ | $2^0$ |
| 0 | 9 | 0 | 0 | 0 | 0 | 1 | 0 | 0 | 1 |
| 1 | 8 | 0 | 0 | 0 | 1 | 1 | 0 | 0 | 0 |
| 2 | 7 | 0 | 0 | 1 | 0 | 0 | 1 | 1 | 1 |
| 3 | 6 | 0 | 0 | 1 | 1 | 0 | 1 | 1 | 0 |
| 4 | 5 | 0 | 1 | 0 | 0 | 0 | 1 | 0 | 1 |
| 5 | 4 | 0 | 1 | 0 | 1 | 0 | 1 | 0 | 0 |
| 6 | 3 | 0 | 1 | 1 | 0 | 0 | 0 | 1 | 1 |
| 7 | 2 | 0 | 1 | 1 | 1 | 0 | 0 | 1 | 0 |
| 8 | 1 | 1 | 0 | 0 | 0 | 0 | 0 | 0 | 1 |
| 9 | 0 | 1 | 0 | 0 | 1 | 0 | 0 | 0 | 0 |

Figure 8:
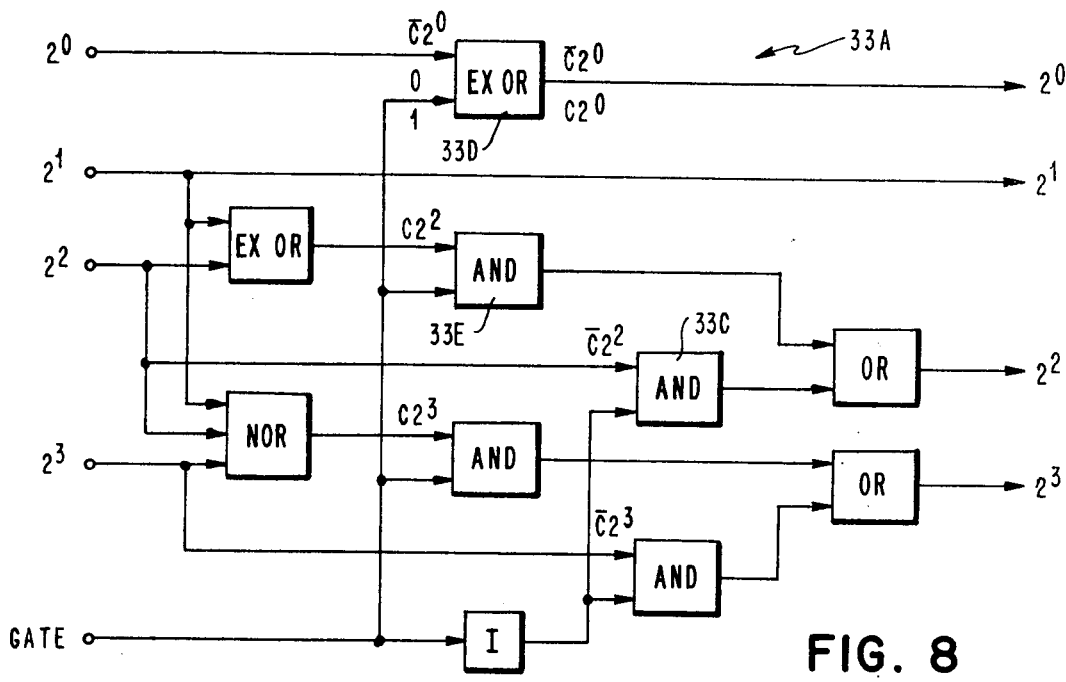
FIG. 8 is a schematic drawing of another portion of the comparing means illustrated in FIG. 6.

$2^0$ is always inverted in complementing
$2^1$ is never inverted in complementing
$2^2$ is inverted only when $2^1$ is high. The two inversion states being
$00 = 0$
$01 = 1$
$10 = 1$ } exclusive or
$11 = 0$ $2^3$ is inverted when $2^1$ and $2^2$ are $= 0$ all zeros $= 1$
any not zero $= 0$ } NOR The gated 9's complement circuitry is illustrated in FIG. 8. The circuitry provides both complemented and uncomplemented bit status for each digit, the complementing being achieved essentially as described above. The proper form of the bits is then gated through to the output by enabling one or the other and the AND gates, for example, 33B or 33C. Thus when the gate input to the inverter and the AND gates is 0 the number becomes 9 complemented.

FIG. 8 illustrates the complemented digits by C$2^n$ and the uncomplemented digits by C$2^n$. The exclusive OR 33D essentially performs the same function as the gating ANDs 33B and 33C and an inverter needed to complement the $2^0$ bit, and is an equivalent circuit. Similarly the $2^1$ bit reduces to a single line as there is never an inversion.

Figure 9:
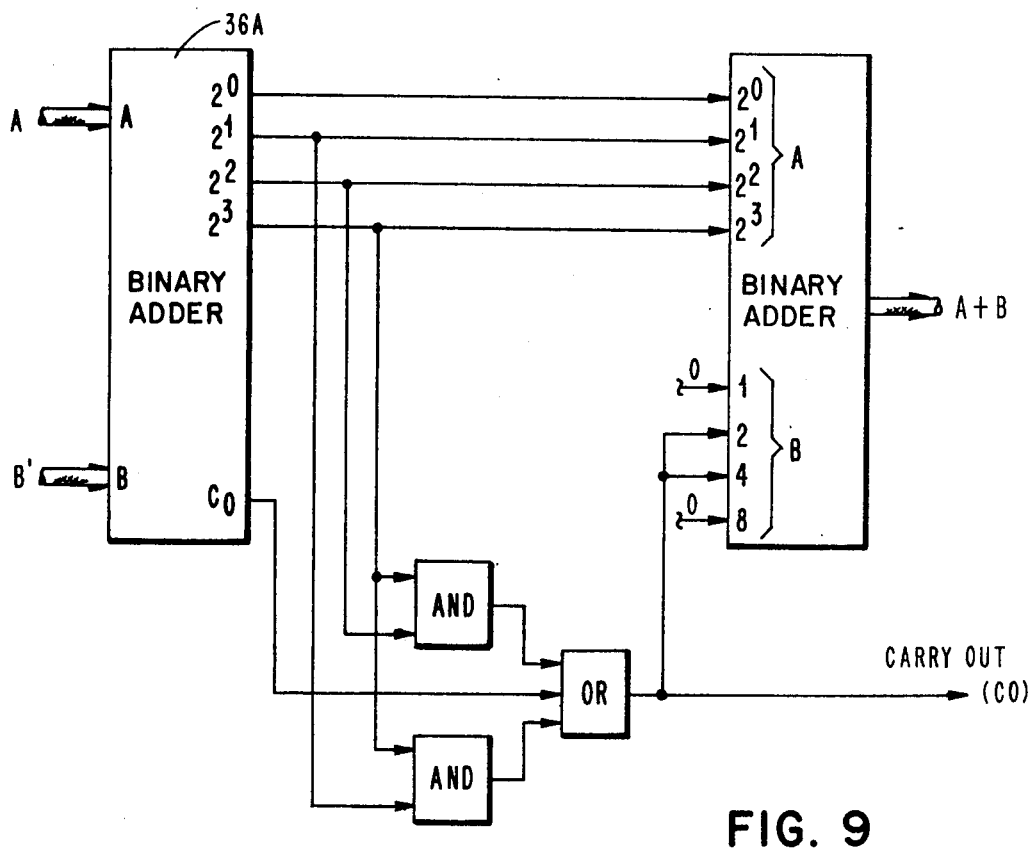
FIG. 9 is a schematic drawing of another portion of the comparing means illustrated in FIG. 6.

The binary coded decimal adders 32A–32N may be constructed of standard parts as shown in FIG. 9. For example, a pair of conventional binary adders may be joined as illustrated in the drawing. The inputs to the first binary adder 36A are the binary coded decimal number corresponding to the desired position and the binary coded decimal number corresponding to the actual position which has been 9 complemented. The pair of AND gates and OR gate are utilized in conjunction with the output of the first binary adder to render a carry out or carry over position to the next succeeding binary coded decimal adder.

The position indicating means signals the digital error generator 31 as to the position of the stage 11, during any particular point in time, and includes an encoder position register 41 which sends a signal along line 41A of the actual address of the stage in binary coded decimal numbers. The output 41A is branched into 41A1, and 41A2, the branch 41A1 providing the B input as described relative to FIGS. 6–9, to the digital error generator 31. The second branch, 41A2 may or may not be utilized depending upon the control system employed. Various control systems will be discussed hereinafter. The encoder position register 41 has a second output preferably to a display of the actual address 42, which is a conventional display illustrating the position of the table in its binary coded decimal number form at any one period of time so that the machine operator, if the machine is operating under manual control, may determine the exact position of the stage. The encoder position register 41 receives an input from an electronic reading head and light source 43 which is optically coupled to a movable scale 44 mounted on the stage, the reading head and light source continuously monitoring the exact position of the stage relative to a fixed reference.

The position indicator means may be purchased as an off-the-shelf item, and may be one of several types. The system employed, however, is the "Teletrak" an absolute digit 1 readout system, supplied by Whitwell Electronic Developments Ltd. at 11 Watt Road, Hillington, Glasgow.

The basic requirement of numerical position measuring systems is the conversion of the analog to digital values because the information to this particular format is better suited for data processing and provides a much higher resolution than may be obtained from practical analog devices. Additionally, as with the use of the display of the actual address, the information may be easily converted to a numerical display for human readability.

There are several types of analog to digital converters when absolute or actual position information is necessary, one of the principal types has been the rotary encoder or digitizer. One version of the device (rotary encoder) translates angular position into digital values by the use of a mechanically rotated shaft with pickup brushes in contact with a stator in the form of a coded disk. The disk includes a plurality of concentric rings which are divided into equal conducting and nonconducting sectors in either a binary or a binary coded decimal sequence. Because of mechanical imperfections, and the small size of pickup brushes, positional errors arise from the use of the coded disk type encoder digitizer. With the disk type encoder or digitizer, therefore, it is necessary to take special precautions to avoid ambiguity in the reading from the positioner.

A preferred type of position indicating means is an optical defraction grating. When two gratings are suitably arranged, interference patterns (MOIRE fringes) are produced of a wavelength equivalent to the pitch of the gratings and of dimensions suitable for use in metrology. The gratings may be manufactured in a conventional manner and the maintenance of a uniform gap between gratings and the relative parallel movement are not excessive and are well within the limits of normal accurate machine practice.

A more complete write-up of the "Teletrak" system may be found in the August 1969 issue of *Automation* (an English publication).

The digital error generator continuously provides a flow of information to the digital to analog converter 27 and thus to the drive motor 12, the information being in the form of a signal indicative of the difference between the actual position of the stage or table and the desired position. At some time when the difference between the desired position and the actual position reaches a finite or small difference, it is necessary to transmit a signal to the stop logic circuitry, and thus the stop switch 25, to open the flow of information to the motor drive amplifier 23 and thus stop the motor 12. To this end, the digital error generator 31 also transmits a signal to a position stop generator 38 from and along line 38B. In its simplest form, the position stop generator 38 is a comparator, which takes an input comprising the difference between the actual and desired table or stage position, and compares it with a preset predetermined value such that when the difference signal is equal to or less than the preset difference, an output signal is generated along line 38A to the latch stop circuitry 35 so as to transmit a signal along line 35B, and 30A to the stop logic 30 (see FIG. 5) thereby opening the circuit and stopping all positional information from being transmitted to the motor drive amplifier 23.

It should be recognized that other methods may be employed to set the position for stopping the drive signal from being transmitted to the motor drive amplifier 23, for example, a signal input from the digital error generator indicating a sign changeover from, for example, plus to minus may be utilized in conjunction with the stop logic 30 to effect a stopping of the transmitted signal to the motor drive amplifier. Additionally, a differential voltage indicative of velocity may be taken from the tachometer buffer 22A and directed to the position stop generator 38 such that when the voltage generated by the tachometer reaches a predetermined lower limit or changes direction, the comparator receives and compares it with a predetermined voltage causing the comparator to change state and provide an output which effects a stop signal through the latch stop circuit 35, via output line 38A, to the stop logic 30.

In order to provide a latching condition to the stop logic 30 under certain predetermined conditions, a latch stop circuit is provided. The purpose of the latch stop circuit 35 is to generate a continuous stop signal to the stop logic 30 when one of the stop conditions, such as a digital error less than some preset, predetermined value, generated by the position stop generator 38, even after such stop condition may no longer exist. Once such stop condition is latched it is then necessary to reestablish a new go signal 35A (see FIG. 2B) to again actuate or energize the motor 12. This condition is necessary inasmuch as it is possible that the stop condition which generates the stop signal may cease to exist even though the stop signal is still desired. For example, if the comparison signal in this position stop generates 38 fixed input is very small it is possible to coast through the site effecting an opposite sign difference signal before stopping. Without a latch the stop signal would cease and the drive motor 12 would again drive the table in the opposite direction precipitating a hunting mode position servo which, as set forth in the objects, is an objective of this invention to eliminate. The latch is also designed to provide for stopping of the motor 12 prior to a generated stop signal by dropping the go signal 35A which enables manual or automatic stopping due to some emergency or desire for a premature stop.

Figure 10:
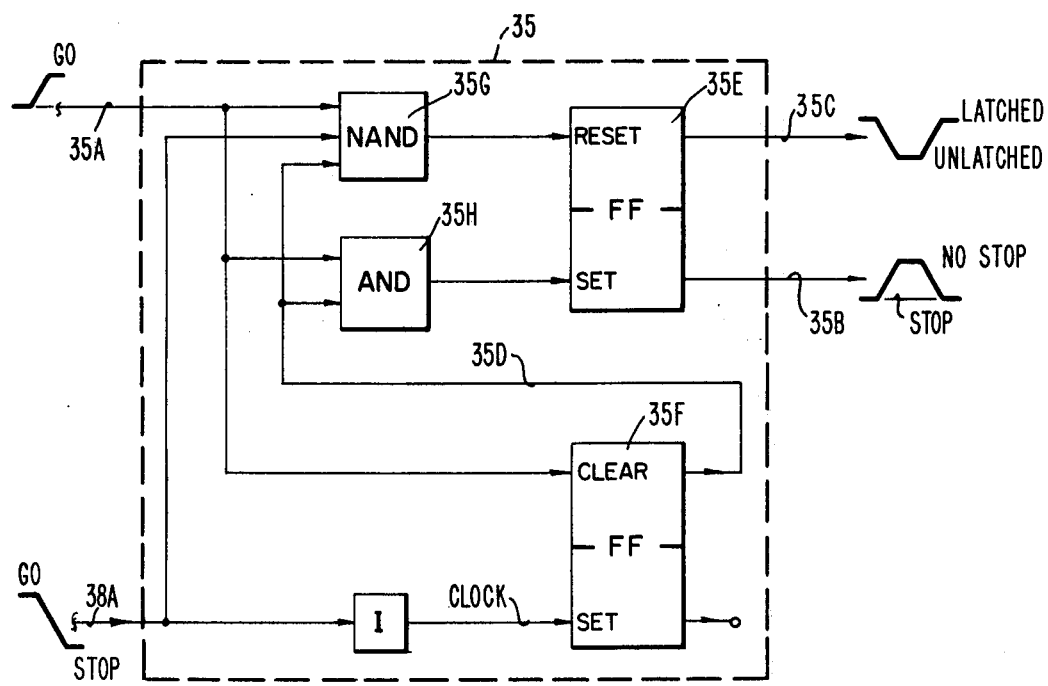
FIG. 10 is a schematic drawing of a latch stop circuitry which may be employed in the apparatus of the present invention.

Referring now to FIG. 10, the latch circuit of the latch stop 35 is illustrated therein. A go signal on input 35A received from the automatic/manual switching gate 50 and thus the control 100, serves to set the flip-flop 35E which raises the level of the stop/no stop signal 35B, the signal 35B being utilized as an output to the input 30A of stop logic 30 (see FIGS. 10, 2B and 2C). Go signal 35A, also serves to clear the flip-flop 35F whose output 35D feeds back to NAND gate 35G and AND gate 35H which control the flip-flop 35E. As shown, a reset output 35C, which is the opposite of the signal on 35B, is fed back to the automatic/manual switching gate 50 to indicate the latched and unlatched condition of the stop 35 and thus the motor 12.

Figure 12:
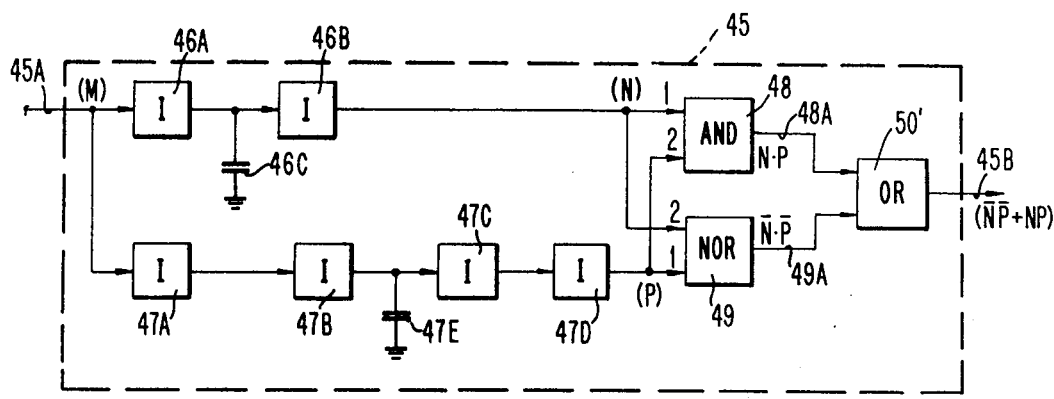
FIG. 12 is a schematic diagram of the ring out detection means utilized to facilitate the operation of the apparatus of the present invention.

As has already been explained when the stage has reached its approximate position, within a predetermined site, the position stop generator transmits a signal which sets the stop logic 30 and thus opens the stop switch 25. In accordance with another feature of the present invention, prior to starting the circuits which control the tool, it is necessary to ensure that all motion of the stage has ceased. To this end, a ring out detection circuit 45 is provided intermediate the tool circuitry (each of the X and Y tool circuitry 75 and 103) and the encoder position register 41 (see FIG. 2B). The ring out detection circuit is best illustrated in FIG. 12 wherein an input signal is received from the encoder position register from line 45A, the input signal comprising, in the present instance, the least significant digit. The least significant digit input from line 45A is coupled to a first and second row of inverters, the first row including inverters 46A, 46B, and the second row including inverters 47A, 47B, 47C, and 47D. In the first row, intermediate inverters 46A and 46B is a capacitor 46C which is connected to ground, while intermediate inverters 47B and 47C in the second row is a second capacitor 47E connected between the row and ground. Each of the rows terminates in a first input 1 to an AND gate 48 and NOR gate 49 respectively, the second inputs being cross-coupled so that the output of inverter 47D comprises the first input of NOR gate 49 and the second input of AND gate 48, while the output of inverter 46B comprises the first input of AND gate 48 and the second input of NOR gate 49. The outputs 48A and 49A are connected from their respective AND and NOR gates to an OR gate 50' which has an output therefrom 45B indicative of a stop ringing condition. To aid in understanding of the operation of the circuit, the input signal from line 45A is designated (M) and the output from inverter 46B is labelled (N), while the output from inverter 47D is labelled (P), therefore both (N) and (P) are applied to both the AND and NOR gates.

The circuit illustrated in FIG. 12 is used to detect when the last bit of the position encoder has stopped changing for a fixed period of time, for example the time $\Delta_t$. As may be seen, (N) follows (M) when (M) goes from a low to high, but has certain time delay $\Delta_t$ due to the action of the capacitor 46C, when (M) goes from high to low. This occurs when TTL logic is used. Alternatively (P) follows (M) when (M) goes from high to low but has a delay time, $\Delta_t$, when (M) goes from low to high. As long as M changes state at a rate less than $\Delta_t$, then (N) cannot equal (P). However, when (M) changes state at a rate greater than $\Delta_t$, then (N = P). Accordingly, the output will be high when the input remains in either state for longer than $\Delta_t$. Thus by altering the size of capacitors 46C and 47E, for example, the ring out time may be adjusted so that when the least significant digit (LSD) from the encoder position register 41 changes at a predetermined slow rate due to the dumping characteristics of the stage, the output signal along output line 45B of the ring out detection circuit 45 will go high indicating a "stop ringing" condition.

The automatic manual switching gate 50 is nothing more than a plurality of switches to receive an input from either a manual control or automatic control circuitry 100, discussed hereinafter. To this end, and turning now to FIG. 11, wherein a portion of an auto/manual switching gate circuit is illustrated, the circuit 50 includes a signal input 50A which emanates either from the automatic portion of the control circuit 100 or from the manual control circuit, the signal being utilized to close either the automatic NAND bus circuit 51, or the manual NAND bus circuit 52. Each of the blocks 51 and 52 illustrated in the drawing may be comprised of, for example, a flip-flop or relay having an output which sets a plurality of switches to permit a flow of information from either the automatic input (A1–A4) or the manual input (M1–M4) to various parts, heretofore described, of the system. If each of the circuits 51 and 52 require an up level input, (digitized 1) an up input to the NAND bus 51 will affect switch closure and permit the inputs A1 through A4 to be provided to the NAND gates 53A, 53B, 53C, 53N, while a logic high input, when applied to the inverter 54 will cause an invert of the logic high giving a logic low keeping the buss 52 open so that manual input of the system is not possible. Alternatively, a logic low applied to the inverter 54 will cause such an inversion in inverter 54 closing the switches in NAND bus circuit 52 and allowing the manual input of signals (M1–M4) to the NAND gates 53A–53N. Thus the NAND gates 53A–53N may receive an input from either the automatic section of the control circuitry 100 or the manual section depending upon the activation of any particular bus 51 or 52.

Figure 11:
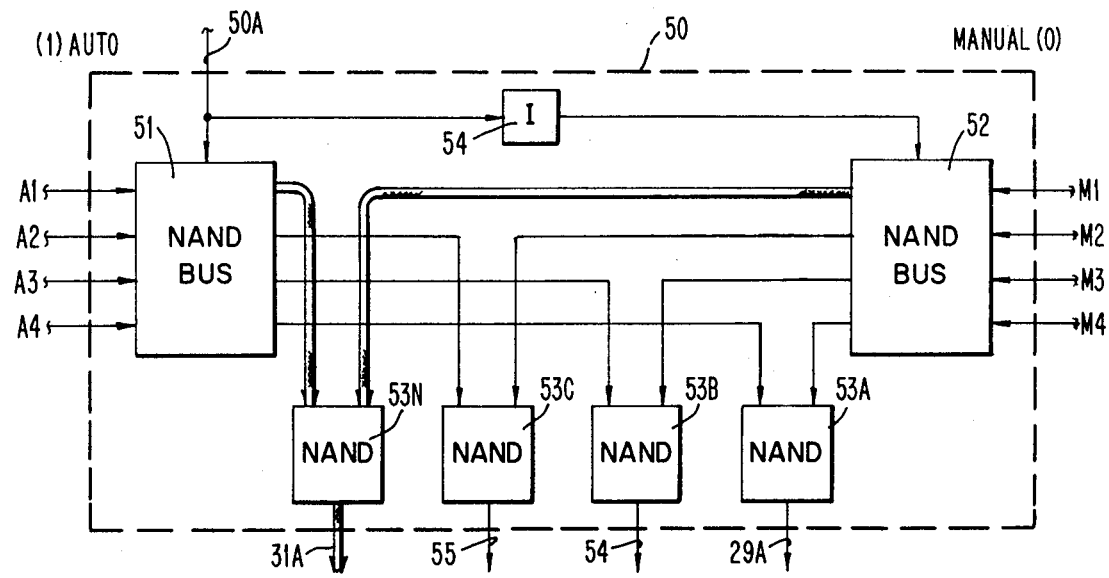
FIG. 11 is a fragmentary schematic diagram of a portion of the automatic manual switching gate utilizing in the apparatus of applicants' invention.

As shown in FIG. 11, various of the outputs of the NAND gates are labelled, for example NAND gate 53A provides an input to gain control 29 to allow presetting of the gain controls gain so as to reduce the velocity of the motor 12 when desired. Additionally, the NAND gate 53B which receives an input A3 or M3, serves to transmit an output signal 54 which branches into an output 54A to a gate (described hereinafter) and to the line 35A to effect an unlatching of the latch stop 35 (see FIG. 2A and 2B). The NAND gate 53C receives an input from either the signal M2 or A2 depending upon which NAND bus circuit 51 or 52 is energized, the signals A2 and M2 serving to reset the encoder position register 41, as by a signal 55 which inputs the encoder position register 41 with the high order digits and bits to reset the encoder. Inputs M1 and A1 feed a plurality of NAND gates 53N through one of their respective NAND bus circuits 51 and 52 when energized, providing an output along bus 31A of the desired stage position relative to some fixed reference.

There are, of course, inputs as well as other outputs that may be used in accordance with the embodiment shown in FIG. 11, for example an input register may include a plurality of NAND gates such as 53A–53N to receive various input information, such as an output 45B1 of the ring out detection circuit 45 indicating that the stage has stopped; the output of the encoder position register 41 along line 41A2 indicating the actual position of the stage; and input from latch stop 35 along line 35C (see FIG. 10) to indicate to the control circuit 100 the condition of the latch stop and thus the stop logic 30. The output of the NAND gates receiving such inputs would be split into NAND bus circuits similar to those described heretofore relative to circuits 51 and 52, so that when energized, the bus would provide an output to the respective one of the controls, either automatic or manual that had been energized. Other outputs are taken from the automatic manual switching gate to, for example, displays 57 and 58. For example, display 57 may be a binary-coded-decimal number display of the desired address while the display 58 illustrates the binary-coded-decimal number corresponding to the actual address.

Figure 13:
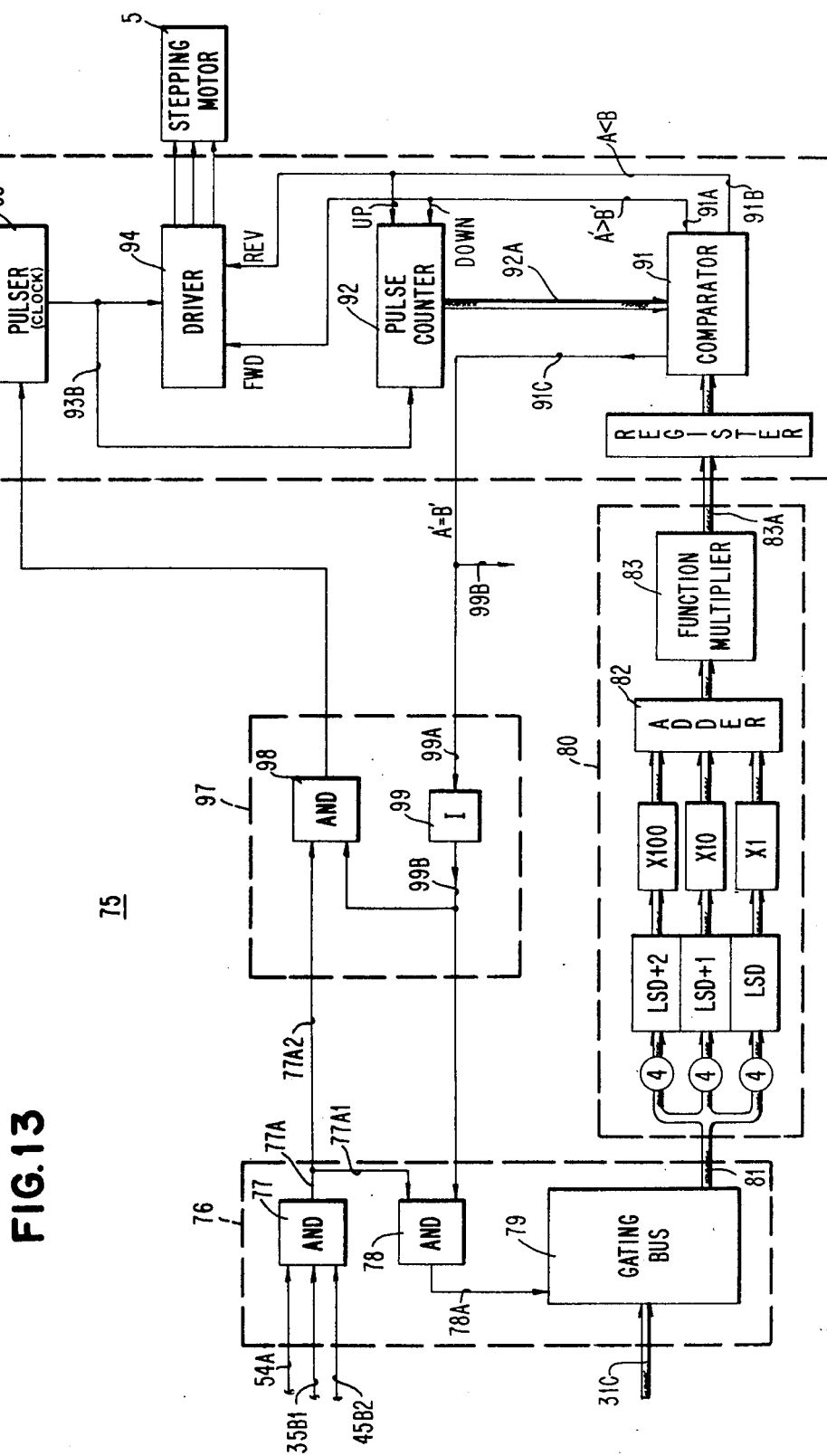
FIG. 13 is a schematic block diagram of the circuitry for controlling the tool.

After the latch stop has been set cutting off the motor 12 and the ring out detection circuitry 45 transmits a signal along line 45B indicating that the stage has settled out, means are provided for energizing the tool 10 to effect a deflection of the tool an amount equal to the remaining difference between the desired position and the actual position of the workpiece so as to enable precise positioning of the tool relative to the workpiece. To this end, and referring first to FIG. 2B, a gate (fine mode) 76, which is part of the tool control circuit 75 (see FIG. 1) is enabled allowing at least the low order bits indicative of the difference between the actual and the desired position, to be applied to a digital converter 80, which converts, in the present instance, the digital information and applies the same to a tool driver 90, for effecting motion of the tool 10. Turning now to FIG. 13, the gate 76 includes a pair of AND gates 77 and 78 and a gating bus 79, the AND gate 77 receiving a first enabling input along line 54A from the output 54 of the auto/manual switching gate 50 (see FIGS. 2A, 2B and 11). The second input to the AND gate is 35B1 from the latch stop 35, the signal from the latch stop being up when the condition is determined that the difference between the desired and the actual address of the stage or table is within the site. The third input to AND gate 77 is from the ring out detection circuit 45, notably input 45B2, it being required as is conventional with AND gating circuitry, that all inputs be up before an output 77A is transmitted therefrom. The output 77A of AND gate 77 applies a first input 77A1 to AND gate 78. The second input to AND gate 78 is transmitted from a fine operation complete circuit 97, which includes an AND gate 98 and an inverter 99. The only time that the inverter 99 receives an up signal on its input 99A so as to apply a down signal at its output 99B is when the input is up and that occurs only when the actual address B' equals the command address A'. (A' = A − B or Desired Position minus Actual Position). Thus when there is a difference between the actual and desired address the output from along line 99B of the inverter 99 is an up signal which, along with the up signal on input 77A1 of the AND gate 78 enables the AND gate permitting it to transmit a signal 78A along line 78A to enable a gating bus 79. The gating bus described previously in reference to FIG. 11 allows transmission of data when the enable line, in this case 78A, is up. The gating bus 79 receives the output signal (A') from the digital error generator 31, which input is designated 31C for purposes of identification. The difference signal A' enters into digital converter 80 (FIG. 13) via bus 81, the least significant digit which is comprised, as is conventional, of four input lines representative of the bits $2^0 - 2^3$, and represented by a box labelled LSD, the next most significant digit, i.e. the least significant digit LSD+1 also representing four lines again representative of the bits $2^0 - 2^3$, and the least significant digit LSD + 2 which is also comprised of four wires $2^0 - 2^3$ bits. The input as illustrated is inherently a multiple, the magnitude of the least significant bits being times 1, for the next most significant bits of course times 10, and for the most significant bits times 100 the output being in digital form (BCK). The input A' from bus 81 enters into an adder or BCD to binary converter 82 which places the output in a binary form to a function multiplier 83 which multiplies the binary output of the adder to obtain the proper number of steps of, for example, a stepping motor per digit. [It should be noted that the adders and function multipliers are standard off the shelf items and comprise conventional adder and function multiplier circuitry.] For example the adder 82 may be a Digital Equipment Corporation (DEC), Maynard, Mass. M230 as shown in DEC's Logic Handbook (1972) at pages 62 and 63. The function multiplier may be for example, a Texas Instrument 4 bit by 4 bit parallel binary multiplier such as illustrated on pages 496 and 497 Texas Instruments "TTL Data Book" for Design Engineers, 1973.

The output of the function multiplier 83 is applied to driver circuitry 90 (see FIG. 2B, and FIG. 13) to apply the correct number of steps to the tool 10 to bring the tool into the proper position relative to the workpiece. To this end and referring once again to FIG. 13, the driver 90 comprises a comparator 91, to which is applied the output of the function multiplier 82 along output bus 82A, and to which is applied the output from a pulse counter 92. A square wave oscillator, sometimes referred to as a pulser or clock 92 applies a pulse to the pulse counter 92 as through output 92B, the output 92A of the pulse counter 92 being applied to the comparator 91. The pulse counter either adds or substracts each pulse from its prior total depending upon whether the difference address A' is greater than or less than the actual address B', as indicated by inputs 91A or 91B. (For information purposes, the lines have been designated A' greater than B' and A' less than B'). The outputs of the comparator along lines 91A and 91B is also applied as well as a driver 94 to control the direction of the driving means which provides the voltage and current necessary for driving, for example, the stepping motor clockwise or counterclockwise associated with the tool 10, in the illustrated instance stepping motor 5 (see FIGS. 13 and 4).

The comparator has a tertiary output along line 91C which is applied to the fine mode complete circuitry 97, and more specifically to the inverter 99, the output 91C branching into an input 99A to the inverter and to a second branch line 99B which is applied, as noted, to the automatic/manual switching gate 50. As heretofore described, when the actual address equals the desired address the output of the comparator along line 91C goes up causing the inverter to go down providing an input to AND gate 98 and to 78 disabling those gates.

For ease of construction, the modules in the driver may be off-the-shelf items such as:

Comparator 91, DEC M168, pp. 48 and 49 of the DEC Logic Handbook (Supra)

Pulse Counter 92, DEC M236, pp. 66, 67 of DEC Logic Handbook (Supra)

Pulser 93, DEC M401, pp. 80, 81 of DEC Logic Handbook (Supra)

Driver 94, DEC K202, pp. 166, 167 of DEC Logic Handbook (Supra)

The control unit 100 (FIG. 1) may include an automatic and manual control to effect the necessary or desired movement of the stage 11 and then the tool 10 as heretofore described. The automatic control may include, for example, a punched or magnetic tape input as well as card either magnetic or punched which automatically inputs the automatic manual switching gate 50 with the required digital information of the desired address. In the same manner, the manual input may include a conventional typewriter like input to input the system with digitizing information as to the desired position of the stage 11, or thumb wheel switches. A typical example of a tape drive that may be employed is an IBM 5028 operator station, or an IBM 2501 card reader while a typical example of the manual input system is a Cherry Electrical Products Corp. Series L-20 lever wheel switch.

Figure 15:
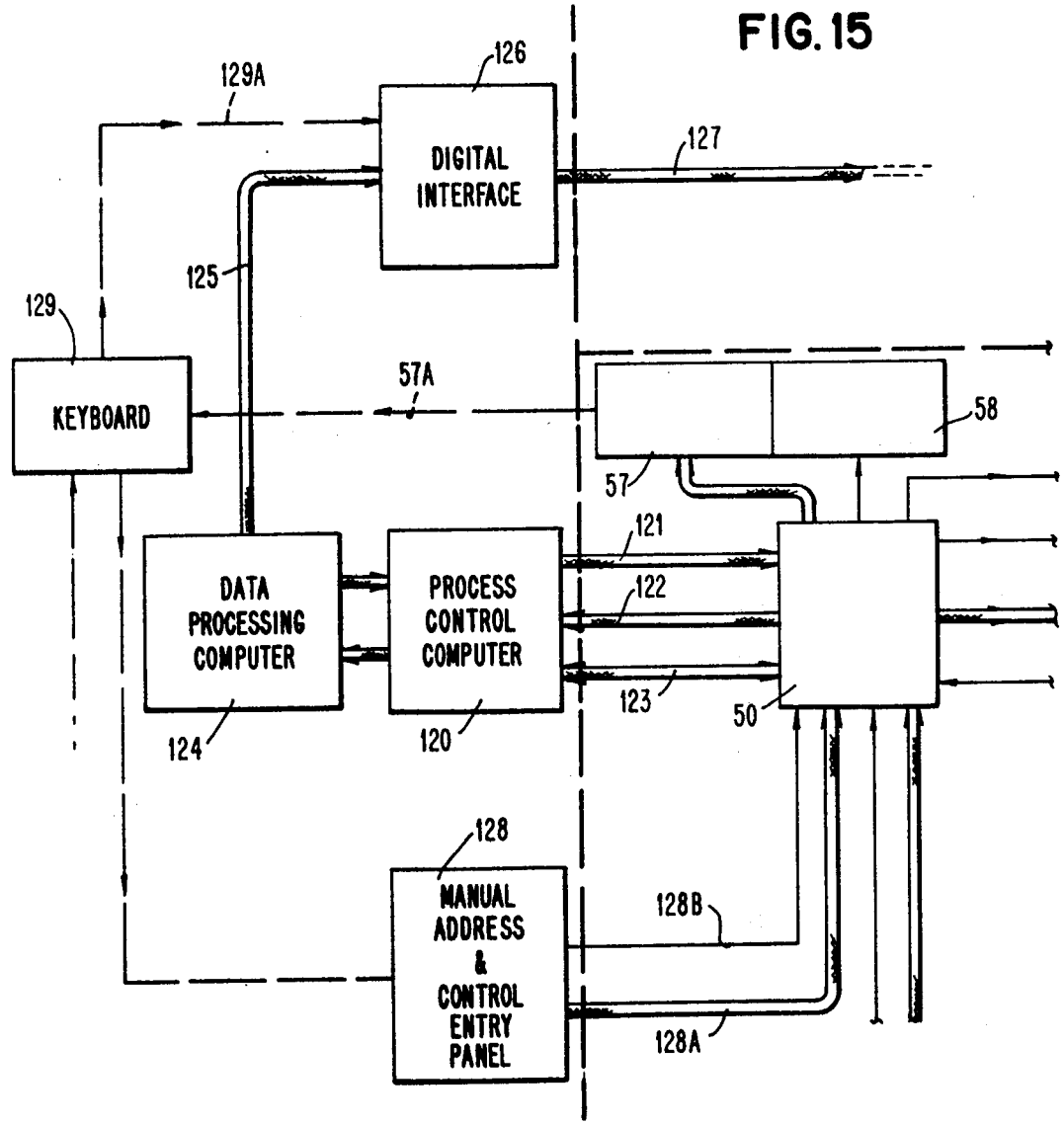
FIG. 15 is a fragmentary schematic view illustrating in block diagram another control system which may be employed with the apparatus of the present invention.

It should be recognized that other control systems may be employed. For example, and as illustrated in FIG. 15, a process control computer 120, such as the IBM System 7, may be employed as a basic input to the automatic manual switching gate, the computer having a first output bus 121 for inputting the desired address to the switching gate 50, a first input bus 122 from the switching gate 50 to indicate, if desired, the actual address of the stage, and a control and status bus 123, which may, for example, input the switching gate 50 with information such as setting the gain control through line 29A (see FIGS. 2B and 2C) giving a direct input to gate 76 as through bus 54A (see FIG. 2B) etc. It may also receive status information from the various parts of the System, for example, polarity reversal conditions as when the stage hits a limit stop, notification from the fine operation complete circuit, etc.

The process control computer 120 may be controlled by a data processing computer 124 (such as an IBM System 370, Model 145). The data processing computer may be also utilized, in this connection, to provide an output 125 to a conventional digital interface 126 for applying work or control information along output bus 127 to, for example, the digital converter 80. In this manner the tool, after reaching its desired position, may be controlled as to its operation on the workpiece W held on the stage 11. To this end, an indication may be taken from the fine operation complete circuit 97 that fine positioning of the tool is complete, such an indication being used to trigger the commencement of actual work on the workpiece W by the tool. In this connection, it should be noted that the manual address and control entry panel 128, which operates in the same manner as the manual control described heretofore, acts as a bypass system for controlling the position of the tool and permits, entry directly into the switching gate 50 as through bus 128A, as well as control information through input line 128B. Manual control of the loop may be also utilized to apply an input to the manual address and control entry panel from The manual keyboard 129, in the illustrated embodiment the keyboard 129 receiving its actual address information as a feedback loop from the display of the desired address 57 as through line 57A. The keyboard may also be used to control the tool by applying a second input 129A from the keyboard to the digital interface 126.

Figure 14:
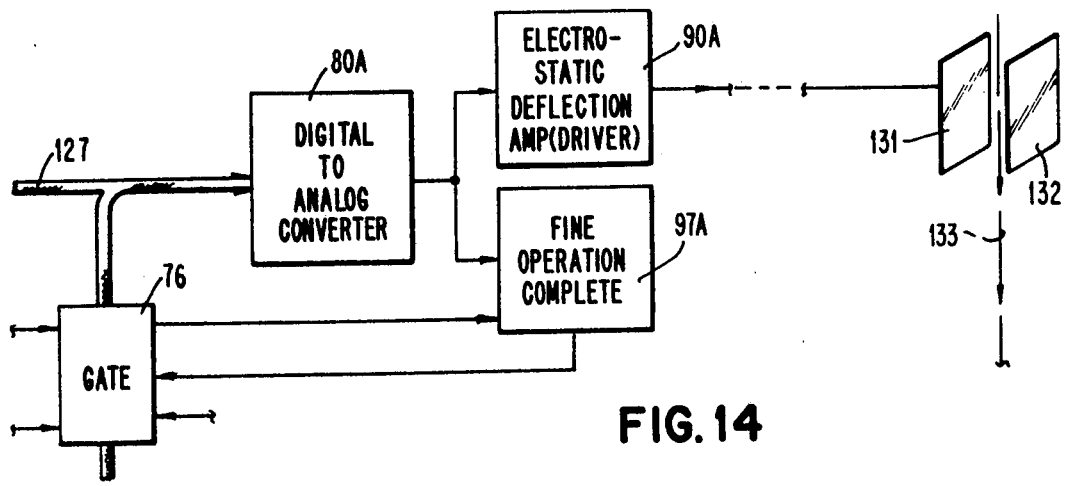
FIG. 14 is another fragmentary schematic view of a modified tool and control circuit therefor for driving electrostatic deflection plates.

It should be recognized that the tool and control circuit therefore may take many forms, for example, in the preferred embodiment the digital converter 80 may take the form of a digital to analog converter 80A (see FIG. 14) which, through an electrostatic deflection amplifier or driver 90A may be utilized to control the electrostatic deflection means such as plates 131 and 132 of an electron beam 133 for precise positioning of the beam relative to the workpiece W, and also to control the movement of the beam to do work on the workpiece, such as the suitably treated silicon wafer. This particular embodiment illustrated in FIG. 14 lends itself to the use of the embodiment illustrated in FIG. 15 wherein the data processing computer, after initial positioning of the E-beam relative to the workpiece in a precise location, is capable of writing circuitry onto suitably covered chips in a silicon semiconductor wafer in a predetermined manner. In the embodiment illustrated in FIG. 14, the fine operation complete circuit 97A may be substantially the same as that disclosed in FIG. 13, the electrostatic deflection amp 90A being nothing more than an operational amplifier, the fine operation complete circuit being actuated when the difference between actual and desired address is equal to zero, or some very small value.

Thus the apparatus of the present invention provides a means of accurately positioning a tool relative to a workpiece in a minimum of time so as to enable maximum thru put of operations of the tool relative to the workpiece.

Although the invention has been described with a certain degree of particularity, it is understood that the present disclosure has been made only by way of example and that numerous changes in the details of construction, the combination and arrangement of parts, and the method of operation may be made without departing from the spirit and the scope of the invention as hereinafter claimed.

What is claimed is:

1. Apparatus for positioning a semiconductor wafer and an electron beam means in a precise location relative to each other by positioning in a predetermined site said semiconductor wafer then positioning the electron beam means in a precise predetermined position relative to said site, said apparatus comprising: a stage, and a semiconductor wafer mounted on said stage, at least one closed loop servo system connected to said stage, positioning means including a motor for positioning said semiconductor wafer in a predeterming site, position indicator means for determining the actual position of said semiconductor wafer relative to a fixed reference, and a signal output from said position indicator means indicative of said actual position of said semiconductor wafer at any one time; an error generator, and means for providing to said error generator the desired position of said semiconductor wafer relative to said reference; and means for inputting said error generator with said signal output from said position indicator means, and means in said error generator to produce a difference signal therefrom indicative of the difference between the actual position of said semiconductor wafter and the desired position of said semiconductor wafer; and means responsive to said difference signal to actuate said positioning means until said difference signal is such that said semiconductor wafer is in said predetermined site; and first means responsive to said difference signal, when said semiconductor wafer is in said predetermined site to stop said positioning means, an electron beam means including electrostatic deflection means to deflect an electron beam, and electrostatic deflection amplifier and means coupling said electrostatic deflection means to said electrostatic deflection amplifier, said amplifier being responsive to said difference signal to effect movement of said beam; ring out detection means responsive to the rate of change of position of said semiconductor wafer, and means for enabling said electrostatic deflection amplifier responsive to an output signal from said ring out detection means indicating that said rate of change of said actual position has reached a predetermined lower value, said electrostatic deflection amplifier effecting beam movement until said difference reaches a predetermined second lower value of thereby effect precise positioning of said beam relative to said semiconductor wafer.

2. Apparatus in accordance with claim 1 including control means coupled to said electrostatic deflection amplifier whereby upon said precise positioning of said electron beam relative to said wafer occurring, said control means operates to effect movement of said beam in a predetermined manner.

* * * * *

UNITED STATES PATENT AND TRADEMARK OFFICE
CERTIFICATE OF CORRECTION

PATENT NO. : 4,019,015

DATED : April 19, 1977

INVENTOR(S) : Javathu K. Hassan et al.

It is certified that error appears in the above-identified patent and that said Letters Patent are hereby corrected as shown below:

Column 1, line 16, "of" should be --or--; line 49, "to" should be --of--. Column 2, line 45, after "removal" insert --of--. Column 4, line 66, "frame 14" should read --frame 14A--. Column 6, line 12, "on" should be --in--. Column 8, line 9, "63" should be --G3--; line 42, "the NAND" should read --to NAND--. Column 9, line 29, "not" should be --no--. Column 10, line 52, "and" should be --of--; line 57, "$C2^n$" should be --$\overline{C2}^n$--. Column 11, line 34, "digit 1" should read --digital--; line 39, "to" should be --in--. Column 16, line 31, after "497" and before "Texas" insert --of--. Column 19, line 9, "and" should be --an--.
Column 20, line 6, "of" should be --to--.

Signed and Sealed this

Thirteenth Day of October 1981

[SEAL]

Attest:

GERALD J. MOSSINGHOFF

Attesting Officer

Commissioner of Patents and Trademarks